United States Patent

Walp

[11] Patent Number: 5,826,061
[45] Date of Patent: Oct. 20, 1998

[54] SYSTEM AND METHOD FOR MODELING METASTABLE STATE MACHINE BEHAVIOR

[75] Inventor: Patrick K. Walp, Sonoma, Calif.

[73] Assignee: DSC Communications Corporation, Plano, Tex.

[21] Appl. No.: 660,911

[22] Filed: Jun. 10, 1996

[51] Int. Cl.[6] .................................................. G06F 17/50
[52] U.S. Cl. .......................................... 395/500; 364/578
[58] Field of Search .............................. 395/500, 182.19, 395/183.09, 650; 364/578, 551.01; 371/57.1, 59, 61; 307/206, 291, 272 A, 289, 360, 279, 269, 480; 328/110, 206; 235/304; 327/24

[56] References Cited

U.S. PATENT DOCUMENTS

| | | | |
|---|---|---|---|
| 3,761,739 | 9/1973 | East et al. | 307/206 |
| 3,764,920 | 10/1973 | Galcik et al. | 328/110 |
| 3,971,960 | 7/1976 | Means et al. | 328/206 |
| 3,983,496 | 9/1976 | Bedford et al. | 328/110 |
| 4,093,878 | 6/1978 | Paschal et al. | 307/291 |
| 4,128,201 | 12/1978 | Barron et al. | 235/304 |
| 4,282,489 | 8/1981 | DeRienzo | 328/206 |
| 4,575,644 | 3/1986 | Leslie | 307/291 |
| 4,591,737 | 5/1986 | Campbell | 307/272 A |
| 4,622,475 | 11/1986 | Whiteley | 307/289 |
| 4,797,838 | 1/1989 | Nelson et al. | 364/551.01 |
| 4,968,902 | 11/1990 | Jackson | 307/360 |
| 4,999,528 | 3/1991 | Keech | 307/279 |
| 5,047,658 | 9/1991 | Shrock et al. | 307/269 |
| 5,095,454 | 3/1992 | Huang | 364/578 |
| 5,122,694 | 6/1992 | Bradford et al. | 307/480 |
| 5,220,668 | 6/1993 | Bullis | 395/650 |
| 5,233,617 | 8/1993 | Simmons et al. | 371/61 |
| 5,410,550 | 4/1995 | Simmons et al. | 371/61 |
| 5,471,159 | 11/1995 | Stuebing et al. | 327/24 |
| 5,550,760 | 8/1996 | Razdan et al. | 364/578 |
| 5,694,579 | 12/1997 | Razdan et al. | 395/500 |

OTHER PUBLICATIONS

"Hazards, Critical Races, and Metastability", by S. Unger, IEEE Transactions on Computers, vol. 44, No. 6, Jun. 1995, pp. 754–768.

"Metastability Evaluation Method by Propagation Delay Distribution Measurement", by B. Rogina et al., IEEE, The Fourth Asian Test Symposium, Jul. 1995, pp. 40–44.

"Metastability of CMOS Latch/Flip–Flop", by L. Kim and R. Dutton, IEEE Journal of Solid–State Circuits, vol. 25, No. 4, Aug. 1990, pp. 942–951.

"Performance Limitations of Stochastic Sensors", by J. Lin and M. Milkovic, IEEE Circuits and Systems, 1992 IEEE Midwest Symposium, Aug. 1992, pp. 408–411.

"Modeling of Real Bistables in VHDL", by A. Acosta et al., IEEE European Design Automation Conference, 1993 and Euro–VHDL 1993, Jan. 1993, pp. 460–465.

*Primary Examiner*—Kevin J. Teska
*Assistant Examiner*—Russell W. Frejd
*Attorney, Agent, or Firm*—Baker & Botts, L.L.P.

[57] ABSTRACT

A method for simulating the behavior of a metastable state machine is presented. The method includes outputting a transitional value when the state machine exhibits metastable behavior, such as when a set-up or hold violation occurs. A randomly-determined value is output after the transitional value is output for a predetermined period of time.

20 Claims, 2 Drawing Sheets

SYSTEM AND METHOD FOR MODELING METASTABLE STATE MACHINE BEHAVIOR

TECHNICAL FIELD OF THE INVENTION

This invention relates in general to the field of computer hardware simulators, and more particularly, to a system and method for simulating the behavior of a metastable state machine.

BACKGROUND OF THE INVENTION

Computer simulations of digital equipment behavior are an important part of the digital equipment design process. For very large digital systems having a large number of individual components, such simulations can save millions of dollars of research and development work if they accurately predict the behavior of the digital equipment being designed.

The ability to model digital equipment depends on the accuracy and the speed of the models used. For example, the Spice computer program may be used to model the behavior of individual circuit components of digital equipment. Nevertheless, because of the detail level of the Spice model, which includes instantaneous voltages and currents and thus requires the input of individual circuit component impedances, the amount of computer time required to simulate complex digital equipment with Spice can be excessive.

Therefore, other simulation programs for digital equipment have been developed. For example, the Verilog and the VHDL programming languages may be used to simulate the behavior of digital equipment. These simulation languages offer several benefits over Spice, such as simplified device models that allow complex digital devices to be simulated with considerably less computing resources.

Nevertheless, the component models available in Verilog and VHDL suffer some drawbacks. For example, real state machines may experience metastable behavior if a setup or hold violation occurs. A setup or hold violation may occur when the value of an input to a state machine changes value, such as from a logical one to a logical zero, during the clock signal transition that is used for timing purposes, such as the leading edge or the trailing edge. When a setup or hold violation occurs, the output or outputs of the state machine will not immediately resolve to the output or outputs that would theoretically be derived from the inputs to the state machine.

Some state machine simulation models simulate metastable behavior by setting the state machine output or outputs to "X," which signifies an unknown output, for an indefinite period of time. This model is pessimistic in that a real state machine will always eventually resolve to either a logical one or a logical zero in a finite time. Accurate simulation of state machine behavior with existing Verilog and VHDL models is presently unavailable. Therefore, it is desirable to accurately simulate metastable behavior of a state machine.

SUMMARY OF THE INVENTION

Therefore, a need has arisen for a system and method for simulating metastable state machine behavior that allows designers to simulate the eventual resolution of the state machine output or outputs to either a logical one or a logical zero.

Accordingly, a system and method for modeling metastable state machine behavior is provided that substantially eliminates or reduces disadvantages associated with prior art systems and methods.

According to one embodiment of the present invention, a method for simulating state machine behavior outputs a transitional value, such as "X," when the state machine exhibits metastable behavior. The method then outputs a randomly-determined value, such as "0" or "1," after outputting the transitional value for a predetermined length of time.

The present invention provides various technical advantages over conventional simulation techniques. For example, one important technical advantage of the present invention is that a user can more accurately simulate the behavior of a real state machine. Digital equipment may thus be designed which takes advantage of the eventual resolution in the output of a metastable state machine.

Another important technical advantage of the present invention is that the behavior of a state machine operating with inputs at two different clock frequencies may be simulated. For example, in a situation with two different clock frequencies, the relative phases of the two clocks is such that the state machine will get a set-up or hold violation on its inputs.

Other technical advantages are readily apparent to one skilled in the art from the following figures, description, and claims.

BRIEF DESCRIPTION OF THE DRAWINGS

For a more complete understanding of the present invention and the advantages thereof, reference is now made to the following descriptions taken in conjunction with the accompanying drawings, in which like reference numbers indicate like features and wherein.

DETAILED DESCRIPTION OF THE INVENTION

Figure 1:
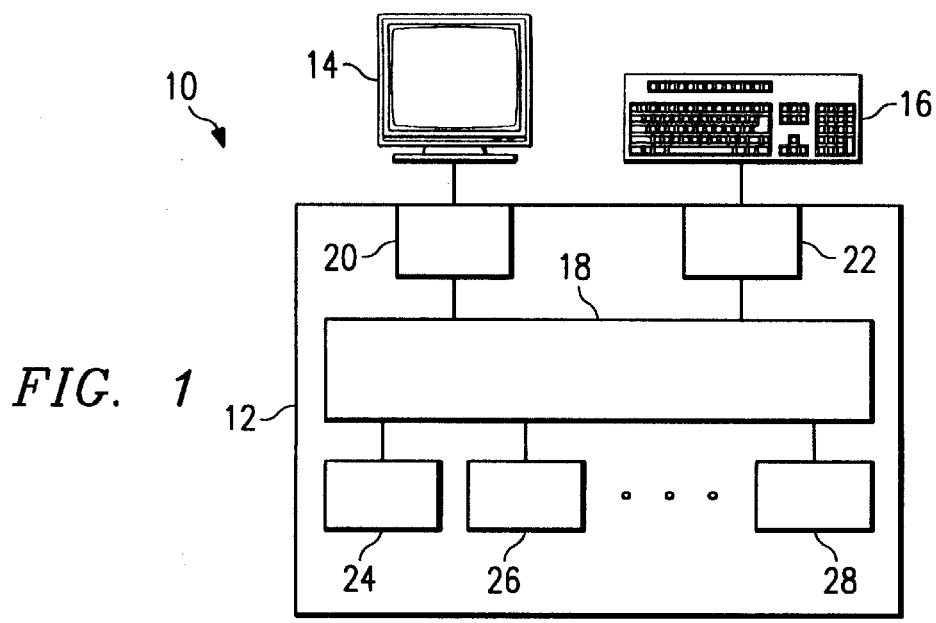
FIG. 1 is a schematic diagram of a digital equipment simulator.

FIG. 1 is a schematic diagram of a digital equipment simulator 10 constructed in accordance with teachings of the present invention. Digital equipment simulator 10 includes a data processor 12, which couples to a display 14 and a keyboard 16.

Data processor 12 may comprise a personal computer having a microprocessor, random access memory (RAM), and other typical components. Data processor 12 may alternately comprise other suitable data processors, such as a workstation or a laptop computer, that are functional to operate and support an operating system 18, a display interface system 20, a input interface system 22, a digital equipment simulation system 24, a digital device model 26, and a metastable state machine simulation model 28. Data processor 12 may encompass one or more microprocessors and various add-on modules, including network interface cards, printer cards, sound cards, CD ROM drive interface cards, and modem cards.

Display 14 is a visual interface that presents visual images which may include text and graphic images for a user.

Display 14 may be a cathode ray tube (CRT) display, a liquid crystal diode (LCD) display or other suitable visual interface devices. Display 14 couples to display interface system 20 of data processor 12.

Keyboard 16 couples to input interface system 22 operating on data processor 12. Keyboard 16 is a data entry device that allows a user to enter data into data processor 12 through input interface system 22. Keyboard 16 may also or alternately comprise suitable data entry devices that are operable to interface with input interface system 22, including an X-Y pointer device such as a mouse or track ball.

Operating system 18 is a software application that operates on data processor 12 and couples to display interface system 20, input interface system 22, digital equipment simulation system 24, digital device model 26, and metastable state machine simulation model 28. Operating system 18 may be one or more software programs that control some operations of data processor 12.

Display interface system 20 is a software application which operates on data processor 12 and controls certain operations of data processor 12. Display interface system 20 may be one or more computer programs. Display interface system 20 couples to display 14 and operating system 18. Display interface system 20 receives data from operating system 18 and transforms the data into a signal for display on display 14.

Input interface system 22 is a software application which operates on data processor 12 and controls certain operations of data processor 12. Input interface system 22 may include one or more computer programs and couples to keyboard 16 and operating system 18. Input interface system 22 receives data from keyboard 16 and transmits the data to operating system 18.

Digital equipment simulation system 24 is a software application which operates on data processor 12 and controls certain operations of data processor 12. Digital equipment simulation system 24 may be one or more computer programs and couples to operating system 18. Digital equipment simulation system 24 also couples to digital device model 26 and metastable state machine simulation model 28, either directly or through operating system 18 as shown in FIG. 1.

Digital device model 26 is a software application which operates on data processor 12 and controls certain operations of data processor 12. Digital device model 26 may be one or more computer programs and may couple to operating system 18 as shown in FIG. 1 or may couple directly to digital equipment simulation system 24. Digital device model 26 receives inputs from digital equipment simulation system 24 either directly or through operating system 18, and performs various operations on these inputs that simulate the behavior of digital devices. Digital device model 26 generates outputs in response to these inputs. These outputs are transmitted to digital equipment simulation system 24 either directly or through operating system 18. As shown in FIG. 1, there may be other digital device models similar to digital device model 26 that simulate the behavior of digital devices.

Metastable state machine simulation model 28 is a software application that operates on data processor 12 and controls certain operations of data processor 12. Metastable state machine simulation model 28 may be one or more computer programs and may couple to operating system 18 or to digital equipment simulation system 24. Metastable state machine simulation model 28 receives inputs from digital equipment simulation system 24 and performs operations on these inputs. Metastable state machine simulation model 28 further outputs data, either directly or through operating system 18 to digital equipment simulation system 24. The operation and function of metastable state machine simulation model 28 will be described in greater detail in regards to FIG. 2.

In operation, a user of digital equipment simulator 10 enters commands through keyboard 16 and input interface system 22 to operating system 18. These commands cause operating system 18 to activate digital equipment simulation system 24. The user then enters commands to digital equipment simulation system 24 through input interface system 22 and operating system 18 which cause digital equipment simulation system 24 to simulate the design of a piece of digital equipment. Digital equipment simulation system 24 outputs a textual and graphic image of the design of the piece of equipment being simulated to display 14 through operating system 18 and display interface system 20. Data processor 12 and digital equipment simulation system 24 are operable to store data that describes the piece of digital equipment being modeled by the user.

When the user has finished modeling the piece of digital equipment with digital equipment simulation system 24, the user enters commands through keyboard 16, input interface system 22, and operating system 18 that cause operating system 18 and digital equipment simulation system 24 to simulate the operation of the piece of digital equipment modeled on data processor 12 and digital equipment simulation system 24. For example, digital equipment simulation system 24 may simulate the performance of various standard tests that may be conducted on actual digital equipment. Thus, digital equipment simulation system 24 simulates the response of the modeled digital equipment to these various standard tests. A user of data processor 12 and digital equipment simulation system 24 is therefore able to predict the behavior of a digital equipment design prior to constructing the actual piece of digital equipment.

During the simulation of the operation of digital equipment on digital equipment simulation system 24 and operating system 18, digital equipment simulation system 24 may transmit inputs to digital device model 26, metastable state machine simulation model 28, and other digital device models. The inputs will typically simulate actual inputs to real physical devices. For example, if digital device model 26 models the behavior of an "AND" gate having five inputs, digital equipment simulation system 24 may model the input of five variables having quantities of either zero or one. Digital device model 26 would then generate the appropriate output for an "AND" gate, such as a zero when any input is zero.

Digital device model 26 may model other digital devices, including an "OR" gate, a "NAND" gate, a "NOR" gate, a "flip flop," an inverter, a level-sensitive latch, a set-reset latch, or other suitable digital devices. As previously mentioned, the transmission of inputs for digital device model 26 from digital equipment simulation system 24 may be either through a direct connection between digital equipment simulation system 24 and digital device model 26 or may be through operating system 18 as shown in FIG. 1. Likewise, the transmission of the output from digital device model 26 may be direct to digital equipment simulation system 24 or may be through operating system 18 as shown in FIG. 1.

Metastable state machine simulation model 28 allows a user of digital equipment simulation system 24 to accurately simulate the behavior of a state machine that receives a set-up or hold violation. As previously described, a set-up or hold violation results from a data transition in the set-up and hold region around the clock transition edge that is used for timing. State machines typically receive a clock input and at least one data input. A clock is a periodically varying signal which changes from a low voltage or logical zero to a high voltage or logical one. The signal remains at logical zero and logical one for a set period of time, and changes at a predetermined rate of change.

Typically, either the "leading edge" transition from low voltage/logical zero to high voltage/logical one, or the "trailing edge" transition from high voltage/logical to low voltage/logical zero is used for timing purposes. Each transition occurs in a transition zone covering a finite period of time. Furthermore, the transition zone for a change from low to high may have a different length of time than the transition zone for a change from high to low, such that the length of time that the clock signal remains at the high value is only approximately equal to the length of time that the clock signal remains at the low value.

If a transition in the data input occurs during the transition zone of the edge used for timing purposes, the output of the state machine may become indeterminate. This is referred to as a set-up or hold violation. The transition zone may be a function of the clock frequency, but is typically less than one second.

Metastable state machine simulation model 28 more accurately simulates the behavior of a metastable state machine by resolving the output of the state machine to a randomly-determined low voltage/logical zero or high voltage/logical one. This allows a user to simulate a design for digital equipment that may capitalize on the ability of state machines to resolve to either a logical zero or logical one within the finite period of time typical for state machines.

Figure 2:
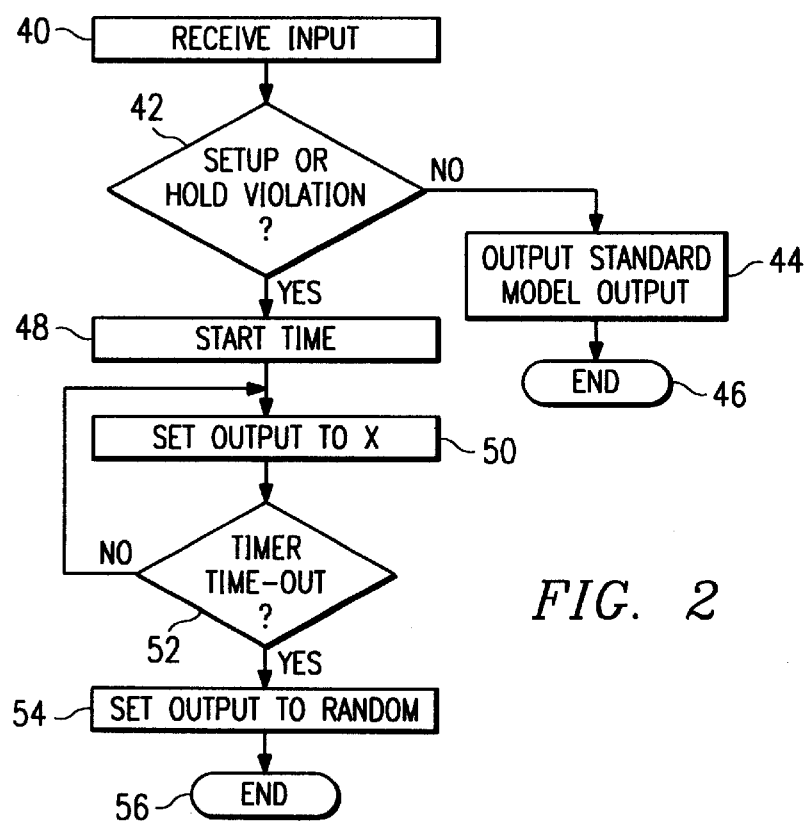
FIG. 2 is a flow chart of a method for modeling the behavior of a metastable state machine.

FIG. 2 is a flow chart of a method for simulating the behavior of a metastable state machine in accordance with teachings of the present invention. At step 40, metastable state machine simulation model 28 receives input from either operating system 18 or digital equipment simulation system 24. This input may include a clock input signal and a data input signal. Furthermore, this input typically changes over a period of time. For example, the simulation model may run at time steps of ten picoseconds, with a clock cycle speed of 2 nanoseconds. Thus, each clock cycle will require 200 program simulation steps.

Furthermore, a clock step will have a transition at the leading edge of a change of state or at the trailing edge of a change of state. For example the transition may last for twenty picoseconds at the leading edge and for thirty picoseconds at the trailing edge. In this example, the two hundred time steps required to simulate one cycle of the clock will include either 2 or 3 time steps over which the clock is in a transition state. Changes occurring to the data input during this transition state may result in a set-up or hold violation.

At step 42, the occurrence of a set-up or hold violation is tested for. As previously described, a set-up or hold violation may occur if a change in the data input occurs during the transition in the set-up and hold region around a clock edge. Such changes may occur when the clock signal and the data signal are driven by differing clock frequencies, such as with asynchronous communications interfaces.

If no set-up or hold violation occurs, then the method proceeds to step 44. At step 44, metastable state machine simulation model 28 generates an output based on the inputs. At step 46, metastable state machine simulation model 28 transmits this output to digital equipment simulation system 24, either directly or through operating system 18.

If a set-up or hold violation does occur at step 42, metastable state machine simulation model 28 starts a timer at step 48. For example, this timer may last fifty picoseconds or five time steps. While the timer runs, metastable state machine simulation model 28 outputs "X" or another suitable transitional value at step 50. The method then proceeds to step 52, where a timer time-out is tested for. If a timer time-out has not occurred, the method returns to step 50 and the output remains set to "X" or the transitional value. When a timer time-out does occur at step 42, metastable state machine simulation model 28 sets the output to a randomly-determined low voltage/logical zero or high voltage/logical one at step 54. For example, metastable state machine simulation model 28 may generate a random number, and set the output to low voltage/logical zero or high voltage/logical one based on this random number.

Randomly setting the output to either low voltage/logical zero or high voltage/logical one accurately simulates the behavior of a metastable state machine. For state machine models in which the resolution of the metastable state is not always either 50% to low voltage/logical zero or 50% to high voltage/logical one, the resolution of the metastable state can be made to match the actual probabilities. For example, if low voltage/logical zero is eighty percent likely to occur after the resolution of a metastable state in a state machine, the probability of a low voltage/logical zero being assigned at step 54 may be set to 80% by generating a random number between 0 and 1 outputting a low voltage/logical zero if the random number is equal to or less than 0.8. After the appropriate output has been transmitted to digital equipment simulation system 24 either directly or through operating system 18, the method proceeds to step 56 and terminates.

One skilled in the art will recognize that this technique may easily be extended for use on other suitable state machines, such as flip flops, level sensitive latches, set reset latches, or other digital component capable of exhibiting metastable behavior. This technique may also be used on a structure that can be built with such items, e.g., a metastable three bit counter will resolve to one of its eight stable states at some finite time after its inputs violate set-up and hold times. Although standard simulation models would cause the output to be three "X's," some simulation needs may better be served by a model which resolves randomly to one of the eight possible states for the three digital outputs instead of staying at "X" indefinitely. One skilled in the art will also recognize that metastable state machine model 28 may include a suitable number of inputs and outputs without departing from the spirit or scope of the present invention.

Figure 3:
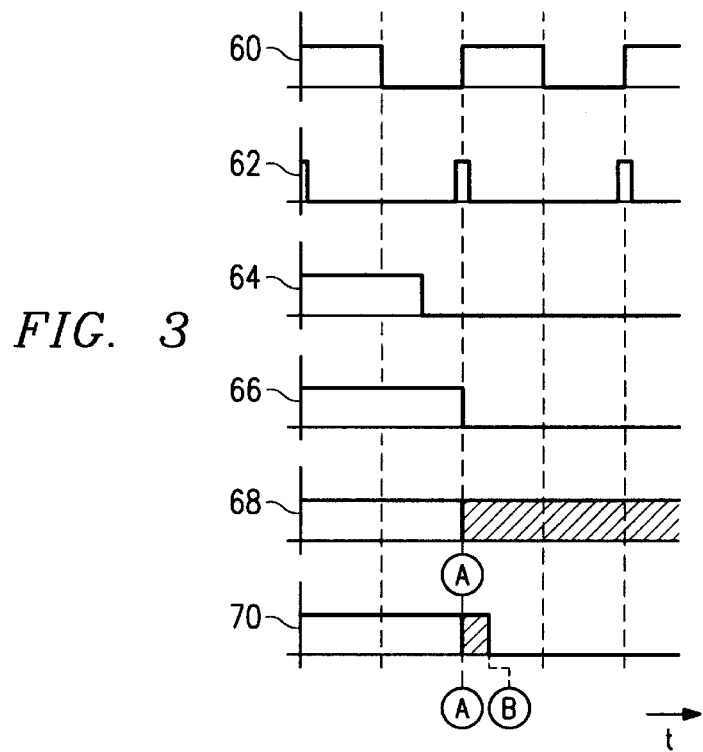
FIG. 3 is a timing diagram for a state machine simulation model.

FIG. 3 is a timing diagram for a state machine embodying concepts of the present invention. Waveform 60 is a clock waveform that may be received as a clock input to metastable state machine simulation model 28. Waveform 62 shows the time period during which the clock signal is in a transition zone. A change in the state of a data signal input to metastable state machine simulation model 28 during a transition zone may cause metastable state machine simulation model 28 to output "X" or a transitional value. FIG. 3 shows that these transition zones coincide with the leading edges of the clock signal shown in waveform 60.

Thus, the data signal input represented by waveform 64 would not result in a set-up or hold violation for metastable state machine simulation model 28. The data signal input shown in waveform 64 changes state at a time that does not coincide with the transitional zones of waveform 62. However, the data signal input represented by waveform 66 would result in a set-up or hold violation for metastable state machine simulation model 28. The data signal input shown in waveform 66 changes state at a time that coincides with one of the transitional zones of waveform 62.

Waveform 68 is an example of an output that does not simulate the actual response of a metastable state machine. At the point marked "A" of waveform 68, the simulated output of a metastable state machine goes from a value of high voltage/logical one to an indeterminate value, as indicated by shading. Metastable state machine simulation model 28 simulates the actual response of a metastable state machine to a data signal similar or identical to that shown by waveform 66, as shown in waveform 70. Although waveform 70 includes an indeterminate value at point "A," it resolves to a value of low voltage/logical zero at point "B." Point "B" represents the passage of a predetermined length of time, and is based upon the actual time required for the metastable state machine that is being modeled to resolve to a final state. As previously mentioned, this final state is randomly determined.

This model may be implemented for use with the Verilog and the VHDL programming languages. One skilled in the art will also recognize that this system and method may be applied to suitable hardware simulation languages.

Figure 4A:
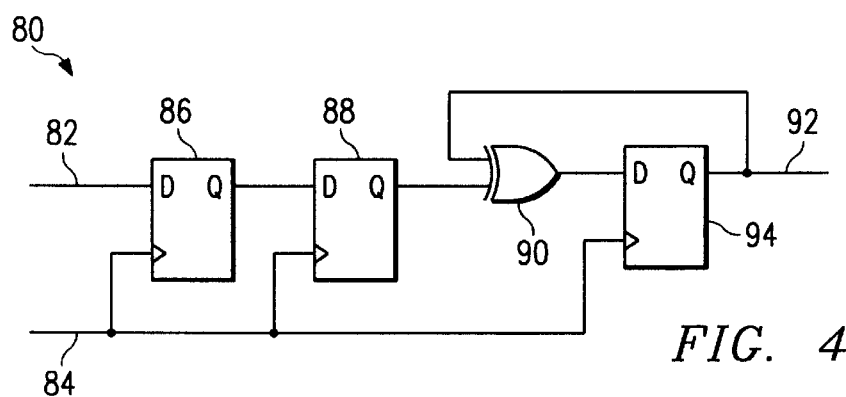
FIGS. 4A and 4B are circuit diagrams of circuits containing metastable flip flop models; and Appendix A contains a listing of computer code embodying concepts of the present invention.
Figure 4B:
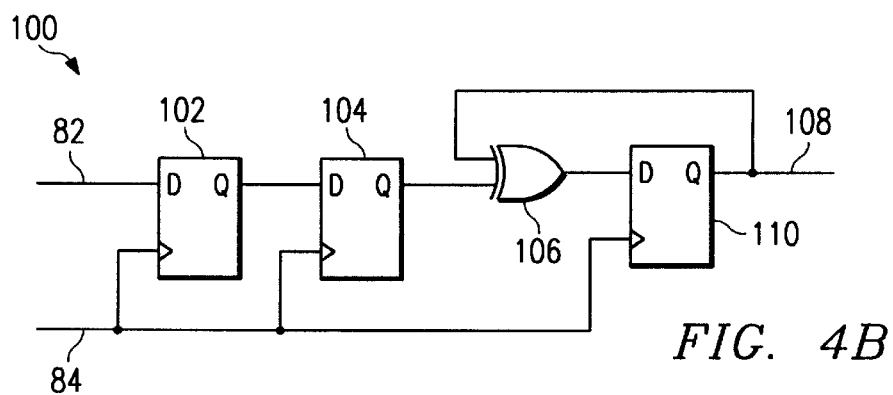

FIGS. 4A and 4B are circuit diagrams of two synchronous state machines. In synchronous state machine 80, a data signal input 82 and a clock input signal 84 couple metastable D-type flip flop model 86. The output of metastable D-type flip flop model 86 and clock input signal 84 couple metastable D-type flip flop model 88. The output of metastable D-type flip flop models 88 and 94 couple exclusive OR gate 90. The output of exclusive OR gate 90 and clock input signal 84 couple metastable D-type flip flop model 94. Metastable D-type flip flop models 86, 88 and 94 model a D-type flip flop that outputs the data received at the input after a delay of one clock cycle, and do not resolve to high voltage/logical one or low voltage/logical zero.

In operation, a data signal is received at data signal input 82 of synchronous state machine 80 and metastable D-type flip flop 86. If the data signal changes state during a transition zone in clock input signal 84, the output of metastable D-type flip flop 86 and input to metastable D-type flip flop 88 becomes indeterminate. Because the indeterminate state does not resolve before the next clock cycle, the indeterminate state propagates to exclusive OR gate 90 and metastable D-type flip flop 94, and the output of state machine 80 becomes locked to indeterminate.

In synchronous state machine 100, data signal input 82 and clock input signal 84 couple metastable D-type flip flop model 102, which resolves to high voltage/logical one or low voltage/logical zero prior to the start of the next clock cycle. The output of metastable D-type flip flop model 102 and clock signal 84 couple metastable D-type flip flop model 104. The output of metastable D-type flip flop model 104 and metastable D-type flip flop model 110 couple exclusive OR gate 106. The output of exclusive OR gate 106 and clock input signal 84 couple metastable D-type flip flop 110. Metastable D-type flip flop models 104 and 110 model a D-type flip flop that outputs the data received at the input after a delay of one clock cycle, and do not resolve to high voltage/logical one or low voltage/logical zero.

In operation, a data signal is received at data signal input 82 of synchronous state machine 100 and metastable D-type flip flop 102. If the data signal changes state during a transition zone in clock input signal 84, the output of metastable D-type flip flop 102 and input to metastable D-type flip flop 104 resolves to either high voltage/logical one or low voltage/logical zero prior to the arrival of the next clock cycle. Thus, the indeterminate state resolves and does not propagate to exclusive OR gate 106 and metastable D-type flip flop 110.

Appendix A contains a computer code listing of computer software that models the circuits and components described in relation to FIGS. 4A and 4B. This computer code embodies concepts of the present invention, and is exemplary of one method for implementing the present invention.

It is apparent that there has been provided a system and method for modeling metastable state machine behavior that satisfies the advantages set forth above. Although the present invention has been described in detail, it should be understood that various changes, substitutions, and alterations can be made herein.

For example, the model may be implemented in many suitable programming languages, and may be used to model metastable behavior of many suitable logical devices. Other examples are readily ascertainable by one skilled in the art and may be made without departing from the spirit and scope of the present invention as defined by the following claims.

Docket No. 036560.5204 PATENT

21

APPENDIX A

```
            timescale 1 ns / 10 ps
            define SETUP 15
            define HOLD 7
            define DELAY 16
            define METASTABLE_TIME 60
            define CYCLE 100
            define INCYCLE 314
            define XOR_DELAY 7 module MetaFlop (clk, D, Q);

            input cli, D;
            output Q;

wire clk, D;
            reg Q, qLocal, metaStable, setupWindow, holdWindow;
            initial
                begin
                    setupWindow = 0;
                    holdWindow = 0;
                    metaStable = 0;
                end always @ (D)
                begin
                    setupWindow = 1;
```

Docket No. 036560.5204                                                                           PATENT

22

```
            #`SETUP;
            setupWindow = 0;
        end 5    always @ (posedge clk)
        begin
            holdWindow = 1;
            #`HOLD;
            holdWindow = 0;
10      end always @ (posedge clk)
        begin
     always @ (posedge clk)
        begin
        if (setup Window)
            begin
            $display("Setup violation");
            Q = 1 'bx;
            end
        else
            begin
            @ (D or negedge holdWindow)
            if (holdWindow)
                begin
                $display("Hold violation");
                Q = 1'bx;
                end
30          else
                Q = D;
```

23

```
        end
    wait(!setupWindow && !holdWindow);
    end
endmodule // NormalFlop module MetaFlopBench;

reg inClk; clk;
reg in;
wire U1out, U2out, U3out, U4out, U5out, U6out, U3in,
U6in;

// First, 2 series D flops followed by a toggle-flop
(made w/ an xor gate)

NormalFlop U1 (clk, in,    U1out);
NormalFlop U2 (clk U1out,  U2out);
NormalFlop U3 (clk U3in,   U3out);
xor #(XOR_DELAY) (U3in, U2out, U3out);

// Same, but with the first one replaced with a
metastable model

MetaFlop   U4 (clk, in,    U4out);
NormalFlop U5 (clk, U4out, U5out);
NormalFlop U6 (clk, U6in,  U6out);
xor # (XOR_DELAY) (U6in, U5out, U6out);
```

Docket No. 0365○○.5204                                                                    PATENT

24

```
     initial
         begin
         inClk = 0;
         clk = 0;
5        U1.Q = 0;
         U2.Q = 0;
         U3.Q = 0;
         U4.Q = 0;
         U5.Q = 0;
         U6.Q = 0;
         end always
         #(CYCLE /2) clk = !clk;
     always
         #(INCYCLE /2) inClk = !inClk;

initial in = 0;
     always @ (posedge inClk)

if (setupWindow)
             begin
             $display("Setup violation");
             metaStable = 1;
             #`METASTABLE_TIME;
             metaStable = 0;
             end
30       else
             begin
```

Docket No. 0365oo.5204                                                                     PATENT

```
        @ (D or negedge holdWindow)
            if (holdWindow)
                begin
                    $display("Hold violation");
                    metaStable = 1;
                    #`METASTABLE_TIME;
                    metaStable = 0;
                end
            end
        end always @ (metaStable)
        begin
        #`DELAY;
        Q = metaStable ? 1' bx : $random & 1'b1;
        end always @ (posedge clk)
        begin
        qLocal = D;
        #`DELAY;
        if (!metaStable)
            Q = qLocal;
        end endmodule // MetaFlop module NormalFlop (clk, D, Q);

input clk, D;
```

Docket No. 036560.5204                                              PATENT

26
```
       output Q;

wire clk, D;
       reg Q, qLocal, setupWindow, holdWindow;

Initial
           begin
           setupWindow = 0;
           holdWindow = 0;
           end always @ (D)
           begin
           setupWindow = 1;
           #`SETUP;
           setupWindow = 0;
           end always @ (posedge clk)
           begin
           holdWindow = 1;
           #`HOLD;
           holdWindow = 0;
           end
```

What is claimed is:

1. A method for simulating the behavior of a state machine, the method comprising the steps of:
   outputting a transitional value when the state machine exhibits metastable behavior; and
   outputting a randomly-determined value after outputting the transitional value for a predetermined length of time, the randomly determined value having a single state.

2. The method of claim 1 wherein the step of outputting a transitional value comprises the steps of:
   receiving a clock input;
   receiving a data input; and
   outputting the transitional value if the data input changes value when the clock input is in a transition zone.

3. The method of claim 2 wherein the clock input is a cyclic time-varying signal that alternates between a first and a second value, wherein the duration of the first value is approximately equal to the duration of the second value, and wherein a transition zone occurs between the first value and the second value.

4. The method of claim 3 wherein the transition zone lasts for a predetermined length of time that is less than one second.

5. The method of claim 2 wherein the step of outputting a randomly-determined value comprises the steps of:
   starting a timer when the transitional value is output;
   generating a random number; and
   outputting an output value based upon the value of the random number.

6. The method of claim 5 wherein the step of outputting an output value further comprises the steps of:
   outputting a first output value signifying a logical zero after the timer has timed-out if the random number is less than a predetermined number; and
   outputting a second output value signifying a logical one after the timer has timed-out if the random number is equal to or greater than the predetermined number.

7. The method of claim 1 wherein the randomly-determined value is one of a first value signifying a logical zero and a second value signifying a logical one.

8. The method of claim 1 wherein the state machine is one of a flip flop, a set-reset latch, and a level-sensitive latch.

9. A method for simulating the behavior of digital equipment, the method comprising the steps of:
   receiving a clock input signal with a transition zone;
   receiving a data input signal;
   outputting a transitional value if the data input signal changes when the clock input signal is in the transition zone; and
   outputting a randomly determined output value after outputting the transitional value for a predetermined period of time, the randomly determined output value having a single state.

10. The method of claim 9 wherein the clock input signal further comprises a cyclic time-varying signal that alternates between a first and a second value, wherein the duration of the first value is approximately equal to the duration of the second value, and wherein the transition zone is between the first value and the second value.

11. The method of claim 9 wherein the randomly-determined output value is one of a first value signifying a logical zero and a second value signifying a logical one.

12. The method of claim 9 wherein the step of outputting a randomly-determined output value comprises the steps of:
   starting a timer when the transitional value is output;
   generating a random number;
   outputting a first output value signifying a logical zero after the timer has timed-out if the random number is less than a predetermined number; and
   outputting a second output value signifying a logical one after the timer has timed-out if the random number is equal to or greater than the predetermined number.

13. The method of claim 10 wherein the transition zone lasts for a predetermined length of time that is less than one second.

14. A system for simulating the behavior of digital equipment, comprising:
   a digital equipment simulator system having an input, an output, and a clock output; and
   a metastable state machine simulation model having an input coupled to the output of the digital equipment simulator system, an output coupled to the input of the digital equipment simulator system, and a clock input coupled to the clock output of the digital equipment simulator system, wherein the metastable state machine simulation model is operable to generate a transition value for a predetermined period of time, and to generate a randomly-determined output of one of a first value and a second value after the predetermined period of time, the first and second values each having a single state.

15. The system of claim 14 further comprising:
   wherein the digital equipment simulator system is operable to simulate a time-varying data signal at the output; and
   wherein the clock output of the digital equipment simulator system is a cyclic time-varying signal that alternates between a first value and a second value, wherein the time duration of the first value is equivalent to the time duration of the second value, and wherein a transition zone having a predetermined time occurs between the first value and the second value.

16. The system of claim 14 wherein the metastable state machine simulation model is further operable to generate the transition value when the value received at the input of the metastable state machine simulation model changes in value during a transition zone of the clock input.

17. The system of claim 14 further comprising an operating system coupled to the input, output, and clock output of the digital equipment simulator system, and to the output, input, and clock input of the metastable state machine simulation model, the operating system operable to transfer signals between the digital equipment simulator system and the metastable state machine simulation model.

18. The system of claim 17 further comprising:
   wherein the digital equipment simulator system is operable to simulate a time-varying data signal at the output; and
   wherein the clock output of the digital equipment simulator system is a cyclic time-varying signal that alternates between a first value and a second value, wherein the time duration of the first value is equivalent to the time duration of the second value, and wherein a transition zone having a predetermined time occurs between the first value and the second value.

19. The system of claim 17 wherein the metastable state machine simulation model is further operable to output the transition value when the value received at the input of the metastable state machine simulation model changes in value during a transition zone of the clock input.

20. The system of claim 14 wherein the transition zone lasts for a predetermined length of time that is less than one second.

* * * * *